US008507901B2

(12) United States Patent
Pan

(10) Patent No.: US 8,507,901 B2
(45) Date of Patent: Aug. 13, 2013

(54) ORGANIC MATERIAL AND ELECTROPHOTOGRAPHIC DEVICE

(75) Inventor: Junyou Pan, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 145 days.

(21) Appl. No.: 13/063,119

(22) PCT Filed: Aug. 12, 2009

(86) PCT No.: PCT/EP2009/005847
§ 371 (c)(1), (2), (4) Date: Mar. 9, 2011

(87) PCT Pub. No.: WO2010/028725
PCT Pub. Date: Mar. 18, 2010

(65) Prior Publication Data

US 2011/0163304 A1 Jul. 7, 2011

(30) Foreign Application Priority Data

Sep. 9, 2008 (EP) .................................... 08015836

(51) Int. Cl.
*H01L 29/08* (2006.01)

(52) U.S. Cl.
USPC ...... 257/40; 257/642; 257/759; 257/E25.008; 257/E25.009; 257/E51.001; 257/E51.027

(58) Field of Classification Search
USPC ............ 257/40, 642, 759, E25.008, E25.009, 257/E51.001, E51.027
See application file for complete search history.

(56) References Cited

U.S. PATENT DOCUMENTS

| | | | | |
|---|---|---|---|---|
| 2003/0207187 | A1* | 11/2003 | Seki et al. | 430/58.7 |
| 2007/0281226 | A1 | 12/2007 | Aziz et al. | |
| 2008/0007164 | A1* | 1/2008 | Suzuki et al. | 313/504 |
| 2008/0074038 | A1* | 3/2008 | Kim et al. | 313/504 |
| 2009/0149627 | A1 | 6/2009 | Pan et al. | |
| 2009/0247728 | A1 | 10/2009 | Pan et al. | |
| 2010/0084672 | A1* | 4/2010 | Ueno et al. | 257/98 |

FOREIGN PATENT DOCUMENTS

| | | | |
|---|---|---|---|
| JP | 2000 019746 | A | 1/2000 |
| WO | WO 2007/131582 | A | 11/2007 |
| WO | WO 2008/009343 | A | 1/2008 |

OTHER PUBLICATIONS

International Search Report of PCT/EP2009/005487, Date of Completion Dec. 8, 2009, Date of Mailing Dec. 16, 2009.
E.Bundgaard et al. "Low band gap polymers for organic photovoltaics,", Solar Energy Materials & Solar Cells, 2007, vol. 93, pp. 449-486.
K.-Y. Law "Organic Photoconductive Materials: Recent Trends and Developments"; Chem. rev., 1993 vol. 93, pp. 449-486.
N. Zchodro, "Photogeneration in Organic Solids," Journal Chem. Phys. 1929, vol. 26, 59, pp. 202-287.
P.M. Borsenberger et al.; "Organic Photoreceptors for Xerograph"; pp. 1-77.

* cited by examiner

*Primary Examiner* — Andy Huynh
(74) *Attorney, Agent, or Firm* — Millen, White, Zelano & Branigan, P.C.

(57) ABSTRACT

The invention relates to an electronic device, particularly photoreceptor or electrophotographic device, comprising an organic function material, which comprises an electron transport component and a hole trap component, to an organic material, which is a mixture or a copolymer comprising an electron transport component and a hole trap component, its use as charge transport material in a photoreceptor or electrophotographic device, especially of the positive charging type, and to electronic devices comprising such a material.

32 Claims, 2 Drawing Sheets

ORGANIC MATERIAL AND ELECTROPHOTOGRAPHIC DEVICE

FIELD OF THE INVENTION

The invention relates to an electronic device, particularly photoreceptor or electrophotographic device, comprising an organic function material, which comprises an electron transport component and a hole trap component. The invention particularly relates to a electrophotographic device with a positive charging. The present invention further relates to an organic material, which is a mixture or a copolymer comprising an electron transport component and a hole trap component, its use as charge transport material in a photoreceptor or electrophotographic device, especially of the positive charging type, and to electronic devices comprising such a material.

BACKGROUND OF THE INVENTION

Since the first electrophotographic machines were developed in 1938, they have found widespread use in document processing. Most of the copiers and printers nowadays used in offices are based on this technology. Owing to its great commercial value, considerable research effort has been devoted to electrophotography and relevant materials.

The key component in an electrophotographic device is the photoreceptor, on which the electrostatic latent images will be generated, which are then transferred onto paper. The entire electrophotographic process comprises the steps of charging of the photoreceptor, imagewise discharge of the photoreceptor, development by toner, transferring the toner image to a sheet of paper, and fixing the toner on the paper by fusing (see Paul M. Borsenberger; David S. Weiss *Organic Photorecptors for Xerography*; Marcel Dekker, Inc., 1998, Chapter 1).

The photoreceptor usually consists of a charge generation layer (CGL), in which free charge carriers are generated upon illumination, and a charge transport layer (CTL), in which the free charge carriers are transported to discharge at the surface. The CTL essentially determines the discharge speed and thus the printing speed of the device, the mechanical robustness and the chemical stability.

In electrophotographic devices of the negative charge type, hole transport materials (HTM) are used as charge transport material (CTM) in the CTL. A typical, widely used organic CTL comprises a mixture of a binding polymer and a CTM, wherein the binding polymer provides the mechanical robustness and the CTM provides the charge transport function. For example, organic systems like polycarbonate (PC) doped with N,N'-Diphenyl-N,N'-bis-(3-methylphenyl)-(1,1'-biphenyl)-4,4'-diamine (TPD) have been successfully used in the CTL of such devices. However, in these devices it was observed that the negatively charged species on the surface can be harmful for the stability of the CTL, which reduces the lifetime of the device.

Electrophotographic devices of the positive charge type, on the other hand, have several advantages over the negative charge type, like for example better resolution and better lifetime of the CTL. These devices require the use of an electron transport material (ETM). However, presently the commercially used ETMs are all inorganic materials, like for example selenium based materials, which are expensive and cannot be used in a flexible device due their brittleness, thus limiting their use in high performance printing system.

It is therefore an aim of the present invention to find alternative and improved materials for electrophotographic devices, in particular improved ETMs for electrophotographic devices of the positive charge type, which have high electron mobility and low dark decay, and are suitable for a high performance printing system. Another aim is to extend the pool of ETMs for use in electrophotographic devices available to the expert. Other aims of the present invention are immediately evident to the expert from the following detailed description.

The inventors of the present invention have found that these aims can be achieved by providing organic materials and electrophotographic devices as described hereinafter.

SUMMARY OF THE INVENTION

The invention relates to an electronic device, preferably a non-electroluminescent electronic device, comprising an electrode, a functional layer having charge transport property and being provided on the said electrode, characterized in that the said functional layer comprises a functional material comprising an electron transport component and a hole trap component, wherein the HOMO (highest occupied molecular orbital) of the said hole trap component is at least 0.3 eV higher than the HOMO of the said electron transport component, and the concentration of the said hole trap component in the functional material is ≦4 mol %.

Preferably the functional material as described above and below is an organic material.

The invention further relates to an electronic device as described above and below, preferably of the positive charge type, which is a charge transport layer, photoreceptor, electrophotographic or xerographic device.

The invention further relates to an electronic device as described above and below, preferably an electrophotographic or xerographic device, wherein the said functional layer is a charge transport layer, preferably an electron transport layer, or both an electron transport and photogeneration layer.

The invention further relates to an electronic device as described above and below, which further comprises a charge generation layer between the electrode and the said functional layer, and wherein preferably the said functional layer is a charge transport layer.

The invention further relates to an electronic device as described above and below which further comprises a counter electrode, in particular an electronic device, preferably a non-electroluminescent electronic device, comprising an electrode, a counter electrode, a functional layer having charge transport property and being provided between the said electrodes, characterized in that the said functional layer comprises a functional material as described above and below.

The invention further relates to an electronic device with a counter electrode as described above and below, which is an organic solar cell (OS-C), a dye-sensitized solar cell (DSSC), an organic spintronic device, a field-quench device, a photodetector or a sensor.

The invention further relates to an organic functional material which is a mixture comprising an electron transport compound and a hole trap compound, wherein the HOMO of the said hole trap compound is at least 0.3 eV, preferably at least 0.4 eV and very preferably at least 0.5 eV higher than the HOMO of the said electron transport compound, and the concentration of the said hole trap compound in the organic functional material is ≦4 mol %, preferably from 0.5 to 4 mol %, more preferably from 1 to 3 mol %, and very preferably from 1 to 2 mol %.

The invention further relates to the use of an organic functional material as described above and below in an electronic device, preferably of the positive charge type, preferably as electron transport material, in particular in the charge transport layer of a photoreceptor, electrophotographic or xerographic device, OS-C, DSSC, organic spintronic device, field-quench device, photodetector or sensor.

DEFINITION OF TERMS

Figure 1:
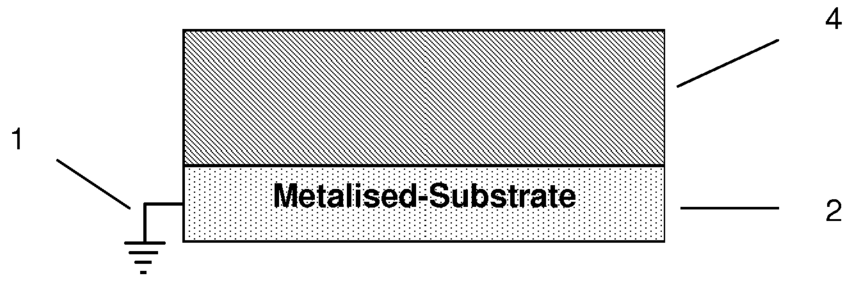
FIG. 1 exemplarily shows a single-layer electrophotographic device according to the present invention.

"Hole trap compound or unit" means a compound or unit having a higher-lying HOMO than the surrounding matrix or backbone, typically with an energy offset of more than 0.3 eV, so that the dwelling time of holes on this compound or unit is much longer than on other units.

"Electron transport compound or unit" means a compound or unit capable of transporting electrons (i.e. negative charges) injected from an electron injecting material or a cathode.

"Non-electroluminescent device" means an electronic device which during its operation does not emit visible light of substantial intensity, and is intended to include devices like for example electrophotographic or xerographic devices or solar cells, but to exclude for example organic light emitting diodes (OLEDs).

"Functional material" means a material for use in a functional layer of an electronic device, like for example a CGL or CTL.

"Organic material" means a material consisting predominantly of organic compounds (as opposed to inorganic compounds), preferably wherein the molar ratio of organic compounds is higher than the molar ratio of inorganic compounds, very preferably consisting essentially of organic compounds, most preferably containing only organic compounds.

"Backbone unit" means a unit that has the highest content (in mol %, unless stated otherwise) of all units present in a copolymer. Backbone units can also form electron transport units or hole transport units alone or in combination with other units. For example, if there are two units whose contents are clearly higher than those of the other units present in the copolymer, or if there are only two units present in a copolymer, then both groups are considered as backbone units. Preferably in the present invention the backbone units are electron transport units.

"Unit" means a monomer unit or repeating unit in a polymer or copolymer.

"Polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int. Ed.* 1999, 38, 885.

"Conjugated polymer" means a polymer containing in its backbone (or main chain) mainly C atoms with $sp^2$-hybridisation (or optionally also sp-hybridisation), which may also be replaced by hetero atoms. In the simplest case this is for example a backbone with alternating C—C single and double (or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom).

Some important energy levels will be explained hereinafter. For functional organic compounds, important characteristic are the binding energies, which are measured with respect to the vacuum level of the electronic energy levels, especially the "highest occupied molecular orbital" (HOMO), and "lowest unoccupied molecular orbital" (LUMO) levels. These can be measured by photoemission, e.g. XPS (X-ray photoelectron spectroscopy) and UPS (ultra-violet photoelectron spectroscopy) or by cyclovoltametry (hereinafter referred to as CV) for oxidation and reduction (oxiduction). It is well understood in the field that the absolute energy levels are dependent of the method used, and even of the evaluation method for the same method, for example the onset point and peak point on the CV curved give different values. Therefore, a reasonable comparison should be made by the same evaluation method of the same measurement method. More recently, the quantum chemistry method, for example Density Function Theory (hereinafter referred to as DFT), has also become well-established to calculate the molecular orbital, particularly the occupied molecular orbitals; and especially the HOMO levels can be well estimated by this method. Therefore, with the help of DFT, given by commercially available software like for example "Gaussian 03W" (Gaussian, Inc.), the HOMO/LUMO of organic small, olecules and the different units in the conjugated polymers can be calculated.

The applicants established a very consistent combination method to determine the energy levels of organic materials. The HOMO/LUMO levels of a set of materials (more than 20 different materials) are measured by CV with a reliable evaluation method and also calculated by the DFT of Gaussian 03W with the same correction functional, for example B3PW91 and the same basis set, for example 6-31G(d). The calculated values are then calibrated according to the measured values. Such calibration factor is used for further calculation. As will be shown below, the agreement between calculation and measurement is very good. Therefore, the comparison of the energy levels of this invention is set on a sound base. In doing so, the applicants found that for most of the groups that are equal to or larger than biphenyl, the simulation on the inventive materials and polymers gives very consistent results.

For determination of energy gaps or bandgaps, the energy levels like the HOMO of different compounds or units should be measured or calculated with the same method. The preferred methods used in this invention are calibrated DFT method and CV measurement, most preferably calibrated DFT method, particularly when the concentration of the compound or unit is low in the material or polymer.

Unless stated otherwise, the values for the energy gap or bandgap given throughout this invention are obtained by the calibrated DFT method.

Unless stated otherwise, groups or indices like Ar, $R^{1-4}$, n etc. in case of multiple occurrence are selected independently from each other and may be identical or different from each other. Thus, several different groups might be represented by a single label like "$R^1$".

"Aryl" or "arylene" means an aromatic hydrocarbon group or a group derived from an aromatic hydrocarbon group. "Heteroaryl" or "heteroarylene" means an "aryl" or "arylene" group comprising one or more hetero atoms. The terms "alkyl", "aryl", "heteroaryl" etc. also include multivalent species, for example alkylene, arylene, heteroarylene etc.

"Carbyl/carbon group" means any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). "Hydrocarbyl/hydrocarbon group" means a carbyl or carbon group that additionally contains one or more H atoms and optionally contains one or more hetero atoms like for example N, O, S, P, Si, Se, As, Te or Ge.

A carbyl or hydrocarbyl group comprising a chain of 3 or more C atoms may be linear, branched and/or cyclic, including spiro and/or fused rings.

DETAILED DESCRIPTION OF THE INVENTION

In a first aspect the invention relates to a non-electroluminescent electronic device comprising an electrode and an organic functional layer comprising an organic functional material comprising an electron transport component and a hole trap component, wherein the HOMO (highest occupied molecular orbital) of the said hole trap component is at least 0.3 eV higher than the HOMO of the said electron transport component, and the concentration of said hole trap component in the organic functional material is ≦4 mol %.

One of the aims of the present invention is to find alternative and improved materials for electrophotographic devices, in particular improved ETMs for electrophotographic devices of the positive charge type, which have high electron mobility and low dark decay. Without wishing to be bound to a specific theory, the inventors of the present invention believe that the following mechanism can be used to explain the effects achieved by the present invention: In order to get low dark decay for positive charging, one could either increase the energy barrier for hole injection, or reduce the hole mobility as low as possible. The present invention follows the latter approach, i.e. introducing the hole trap in an electron transport matrix or host. Two aspects are essential for a selected material in order to function as a hole trap in an electric field. One is that the HOMO offset between the hole trap and the electron transport matrix should be large enough to ensure the hole to be trapped even under high electric field. The inventors found that for this purpose a 0.3 eV offset is necessary. The other aspect is the concentration of the hole trap in the matrix. To immobilise the hole on the hole trap, the distance between the hole trap sites should be large enough to avoid the hopping between them. The inventors found that for this purpose the concentration of hole traps should be than or equal to 4 mol %. However, the mechanisms underlying the present invention are not limited to those described above. There may be other theories that are better suitable for describing the mechanism of the present invention.

The HOMO of the said hole trap component is preferably at least 0.4 eV, more preferably at least 0.5 eV higher than the HOMO of the said electron transport component.

The concentration of the hole trap component is preferably from 0.1 to 4 mol %, more preferably from 1 to 3 mol %, and most preferably from 1 to 2 mol %.

In a preferred embodiment of the present invention the organic functional material is a mixture comprising two or more compounds, one or more of which are electron transport compounds and one or more of which are hole trap compounds. Preferably the electron transport compound(s) constitute(s) the host component of the material.

The mixture may comprise one or more monomeric compounds (small molecules) and/or one or more polymeric compounds. It may consist only of monomeric compounds, or may consist only of polymeric compounds, or may contain both monomeric and polymeric compounds.

In a preferred embodiment of the present invention at least one of the electron transport compound(s) and the hole trap compound(s), preferably at least the hole trap compound(s), are selected from monomeric compounds.

In another preferred embodiment of the present invention at least one of the electron transport compound(s) and the hole trap compound(s), preferably at least the electron transport compound(s), are selected from polymeric compounds.

In another preferred embodiment of the present invention both the electron transport compound(s) and the hole trap compound(s) are selected from monomeric compounds.

In another preferred embodiment of the present invention both the electron transport compound(s) and the hole trap compound(s) are selected from polymeric compounds.

The monomeric hole trap compounds are preferably selected from amines, triarylamines and derivatives thereof. The monomeric electron transport compounds are preferably selected from compounds comprising one or more moieties selected from the group consisting of anthracene, benz-anthracene, ketone, imidazole, benzolimidazole, phenanthrene, dihydro-phenanthrene, fluorene, indenofluorene, spirobifluorene, triazine, pyridine, pyrimidine, pyridazine, pyrazine, oxadiazole, quinoline, quinoxaline, pyrene, perylene, phosphinoxide, phenazine, phenanthroline, triarylborane and derivatives thereof, all of which are optionally substituted.

In another preferred embodiment of the present invention the organic functional material is or comprises a copolymer, preferably a conjugated copolymer, comprising two or more different repeating units, wherein said copolymer comprises one or more electron transport units and one or more hole trap units. Preferably the electron transport unit(s) constitute(s) the backbone unit(s) of the copolymer. In case of dendrimers, the dendrimer core preferably contains a hole trap moiety.

In another preferred embodiment of the present invention the functional material does only contain one or more of such copolymers, and optionally further additives without electron transport or hole trap properties, and does not contain further compounds with electron transport or hole trap properties.

The hole trap units are preferably selected from units comprising one or more optionally substituted amine or triarylamine groups or derivatives thereof. The electron transport units are preferably selected from units comprising one or more moieties selected from the group consisting of anthracene, benzanthracene, ketone, imidazole, benzolimidazole, phenanthrene, dehydrophenanthrene, fluorene, indenofluorene, spirobifluorene, triazine, pyridine, pyrimidine, pyridazine, pyrazine, oxadiazole, quinoline, quinoxaline, pyrene, perylene, phosphinoxide, phenazine, phenanthroline, triarylborane and derivatives thereof, all of which are optionally substituted.

In another preferred embodiment of the present invention the organic functional material is a polymer blend, comprising at least one polymer containing one or more electron transport units and at least one polymer containing one or more hole trap units.

In another preferred embodiment of the present invention the organic functional material is a blend or mixture of monomeric and polymeric compounds, comprising at least one electron transport compound and at least one hole trap compound.

In another preferred embodiment of the present invention organic functional material is a mixture comprising a polymer or copolymer with electron transport property and a hole trap compound which is a monomeric or polymeric compound. The electron transport (co)polymer preferably comprises one or more units comprising one or more moieties selected from the group consisting of anthracene, benzanthracene, ketone, imidazole, benzolimidazole, phenanthrene, dehydrophenanthrene, fluorene, indenofluorene, spirobifluorene, triazine, pyridine, pyrimidine, pyridazine, pyrazine, oxadiazole, quinoline, quinoxaline, pyrene, perylene, phosphinoxide, phenazine, phenanthroline, triarylborane and derivatives thereof, all of which are optionally substituted.

The polymers and copolymers as described above and below are preferably selected from the group consisting of conjugated (co)polymers.

Preferred monomeric electron transport compounds are selected from the group consisting of benzanthracene derivatives, as disclosed for example in WO 2007/114358 A, of the following formula:

1

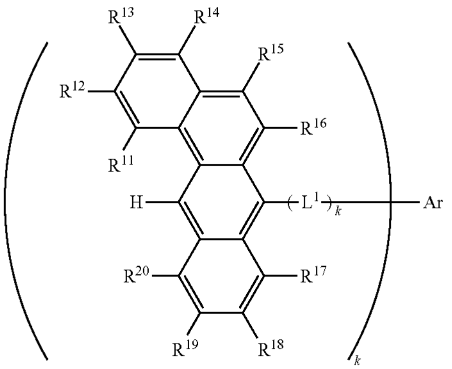

wherein $L^1$ is a linking group, which is a single bond, a substituted or unsubstituted divalent aromatic hydrocarbon cyclic group having 6 to 50 nuclear carbon atoms, a substituted or unsubstituted divalent aromatic heterocyclic group having 5 to 50 nuclear atoms, a substituted or unsubstituted fluorenylene group or a substituted or unsubstituted carbazolylene group;

k is an integer of 1 to 4 and, when k represents an integer of 2 or greater, a plurality of linking groups represented by $L^1$ may be same as or different from each other, Ar is a single bond, hydrogen atom, a substituted or unsubstituted aromatic hydrocarbon cyclic group having 6 to 50 nuclear carbon atoms, a substituted or unsubstituted aromatic heterocyclic group having 5 to 50 nuclear atoms, fluorenyl group or carbazolyl group, $R^{11-20}$ each independently represent a hydrogen atom, a substituted or unsubstituted aromatic hydrocarbon cyclic group having 6 to 50 nuclear carbon atoms, a substituted or unsubstituted aromatic heterocyclic group having 5 to 50 nuclear atoms, a substituted or unsubstituted alkyl group having 1 to 50 carbon atoms, a substituted or unsubstituted cycloalkyl group having 3 to 50 nuclear carbon atoms, a substituted or unsubstituted alkoxy group having 1 to 50 carbon atoms, a substituted or unsubstituted aralkyl group having 6 to 50 nuclear carbon atoms, a substituted or unsubstituted aryloxy group having 5 to 50 nuclear carbon atoms, a substituted or unsubstituted arylthio group having 5 to 50 nuclear carbon atoms, a substituted or unsubstituted alkoxycarbonyl group having 1 to 50 carbon atoms, a substituted or unsubstituted silyl group 1 to 50 carbon atoms, carboxy group, a halogen atom, cyano group, nitro group or hydroxy group.

Further preferred monomeric electron transport compounds are selected from the group consisting of compounds containing a moiety —C(═X)—, where X is selected from O, S, Se, as disclosed for example in WO 2004/093207 A2 and WO 2004/013080A1, most preferably fluorene-ketones, spirobifluorene-ketones or indenofluorene-ketones selected from the group consisting of the following formula:

2

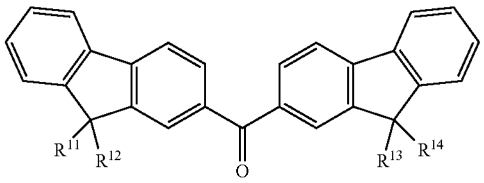

3

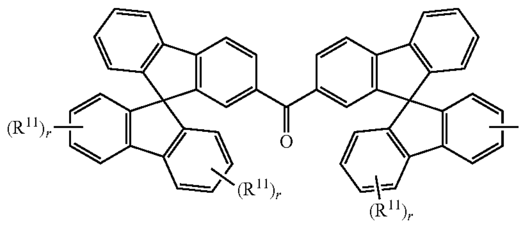

4

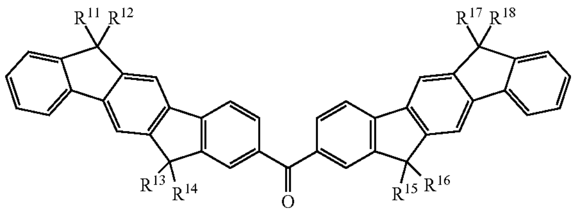

wherein $R^{11-18}$ are as defined in formula 1, optionally one or more of the pairs $R^{11}$ and $R^{12}$, $R^{13}$ and $R^{14}$, $R^{15}$ and $R^{16}$, $R^{17}$ and $R^{18}$ form a ring system, and r is 0, 1, 2, 3 or 4.

Further preferred monomeric electron transport compounds are selected from the group consisting of anthracene derivatives, as disclosed for example in JP 3148176 B, WO 2005/061656 A1, EP0681019B1, WO 2004/013073A1, U.S. Pat. No. 5,077,142, WO 2007/140847 and US 2007/0205412A1, most preferably selected from the group consisting of the following formulae:

5a

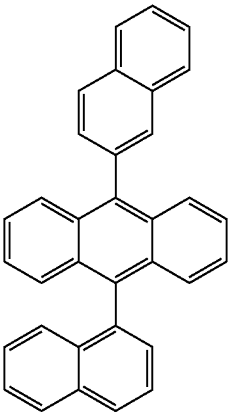

5b

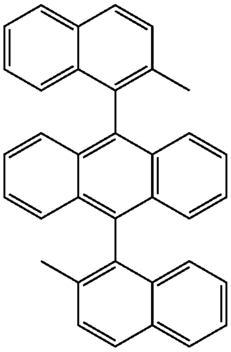

Further preferred monomeric electron transport host compounds are selected from the group consisting of imidazole derivatives or benzoimidazole derivatives as disclosed for example in US 2007-0104977A1, most preferably selected from the group consisting of the following formulae:

6a

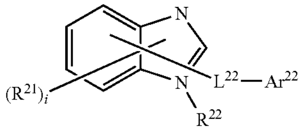

6b

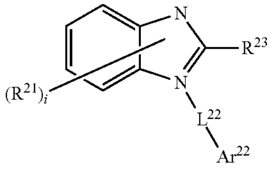

wherein $R^{21}$ is a hydrogen atom, a C6-60 aryl group which may have a substituent, a pyridyl group which may have a substituent, a quinolyl group which may have a substituent, a C1-20 alkyl group which may have a substituent, or a C1-20 alkoxy group which may have a substituent;

i is 0, 1, 2, 3 or 4;

$R^{22}$ is a C6-60 aryl group which may have a substituent, a pyridyl group which may have a substituent, a quinolyl group which may have a substituent, a C1-20 alkyl group which may have a substituent, or a C1-20 alkoxy group which may have a substituent;

$R^{23}$ is a hydrogen atom, a C6-60 aryl group which may have a substituent, a pyridyl group which may have a substituent, a quinolyl group which may have a substituent, a C1-20 alkyl group which may have a substituent, or a C1-20 alkoxy group which may have a substituent;

$L^{22}$ is a C6-60 arylene group which may have a substituent, a pyridinylene group which may have a substituent, a quinolinylene group which may have a substituent, or a fluorenylene group which may have a substituent; and $Ar^{22}$ is a C6-60 aryl group which may have a substituent, a pyridinyl group which may have a substituent, or a quinolinyl group which may have a substituent.

Further preferred monomeric electron transport host compounds are selected from the group consisting of benzoimidazole derivatives of the following formulae:

7a

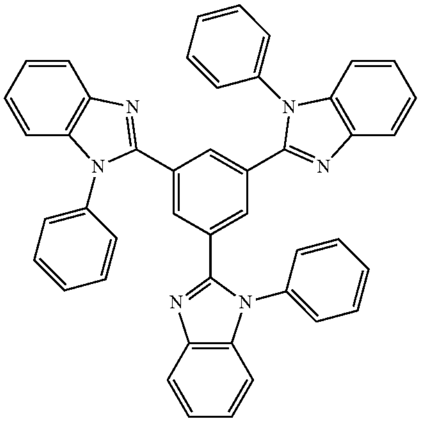

7b

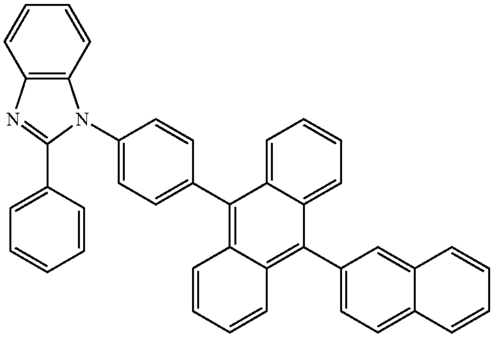

Further preferred monomeric electron transport host compounds are selected from the group consisting of oxadiazole, oxazole, thiazole, phenanthroline, tris(8-hydroxyquinolinato)aluminium ($AlQ_3$) and their derivatives, and compounds comprising a group of the following formula

8

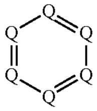

(triazine derivatives), wherein 2, 3 or 4 groups Q denote and the others each independently denote CR, with R being as defined above, as disclosed for example in DE 10356099A1 and U.S. Pat. No. 6,352,791 B1.

The content of electron transport compounds, preferably selected of formula 1-8, in the material is preferably from 96 to 99.9 mol %.

Preferred monomeric hole trap compounds are selected from the group consisting of triarylamine derivatives of the following formula:

9

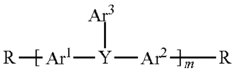

wherein

Y is N, P, P═O, $PF_2$, P═S, As, As═O, As═S, Sb, Sb═O or Sb═S, preferably N, $Ar^1$ which may be the same or different, denote, independently if in different repeat units, a single bond or an optionally substituted mononuclear or polynuclear aryl or heteroaryl group, $Ar^2$ which may be the same or different, denote, independently if in different repeat units, an optionally substituted mononuclear or polynuclear aryl or heteroaryl group, $Ar^3$ which may be the same or different, denote, independently if in different repeat units, an optionally substituted mononuclear or polynuclear aryl or heteroaryl group, m is 1, 2 or 3, and R which may be the same or different, is selected from H, substituted or unsubstituted aromatic or heteroaromtic group, alkyl, cycloalkyl, alkoxy, aralkyl, aryloxy, arylthio, alkoxycarbonyl, silyl, carboxy group, a halogen atom, cyano group, nitro group or hydroxy group.

Especially preferred compounds of formula 9 are selected from the following subformulae:

9a

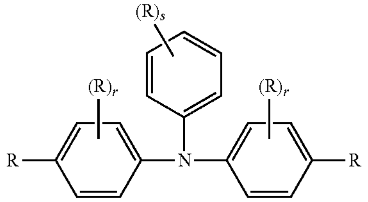

9b

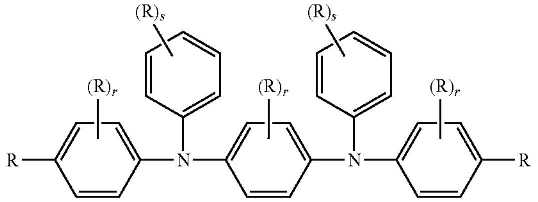

9c

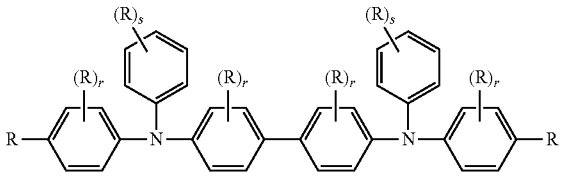

wherein R is as defined in formula 9, r is 0, 1, 2, 3 or 4, and s is 0, 1, 2, 3, 4 or 5.

The content of hole trap compounds, preferably selected of formula 9a-c, in the material is preferably from 0.1 to 4 mol %, more preferably from 1 to 3 mol %, and very preferably from 1 to 2 mol %.

In another preferred embodiment the electronic device comprises an organic function material which is a copolymer comprising one or more electron transport units and one or more hole trap units, very preferably a copolymer containing, most preferably consisting exclusively of, an electron transport polymer backbone and one or more hole trap units.

Preferably, the hole trap units are selected from the group consisting of triarylamine derivatives of the following formula:

10

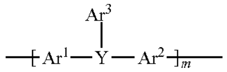

wherein $Ar^1$, $Ar^2$, $Ar^3$, Y and m are as defined in formula 9.

Especially preferred units of formula 10 are selected from the following subformulae:

10a

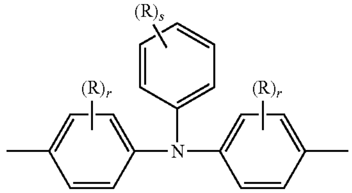

10b

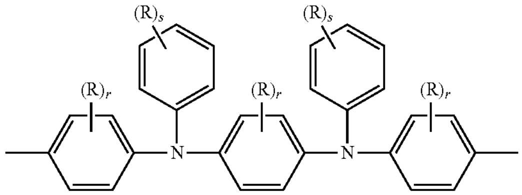

10c

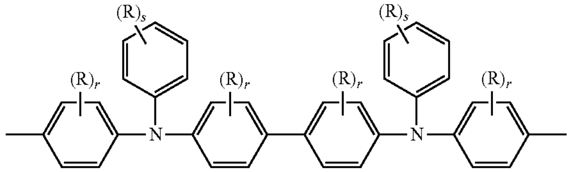

wherein R, r and s are as defined in formula 9a.

Preferably, the polymer or copolymer with electron transport property comprises one or more units selected of the following formula (as electron transport unit), preferably as backbone units:

11

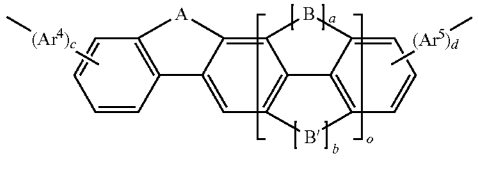

wherein

A, B and B' are independently of each other, and in case of multiple occurrence independently of one another, a divalent group, preferably selected from $-CR^1R^2-$, —$NR^1$—, —$PR^1$—, —O—, —S—, —SO—, —$SO_2$—, —CO—, —CS—, —CSe—, —P(=O)$R^1$—, —P(=S)$R^1$— and —$SiR^1R^2$—, $R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally containing one or more hetero atoms, each a is independently one of 0 and 1 and each corresponding b in the same unit is the other of 0 and 1 (so that when a is 0 then b is 1 and vice versa), o is an integer ≧1, preferably 1, 2, 3 or 4, most preferably 1 or 2, $Ar^4$ and $Ar^{y}$ are independently of each other mono- or polynuclear aryl or heterorary1 that is optionally substituted and optionally fused to the 7,8-positions or 8,9-positions of the indenofluorene group, c and d are independently of each other 0 or 1, If the groups $R^1$ and $R^2$ form a spiro group with the fluorene group to which they are attached, it is preferably spirobifluorene.

Preferred units of formula 11 are selected from the following subformula:

11a

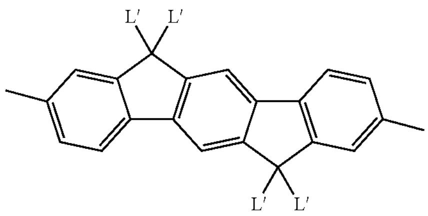

11b

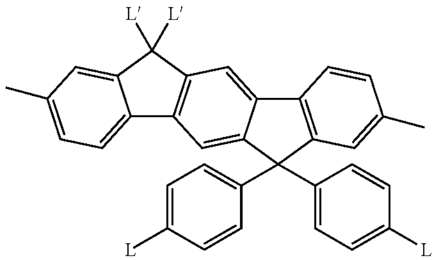

11c

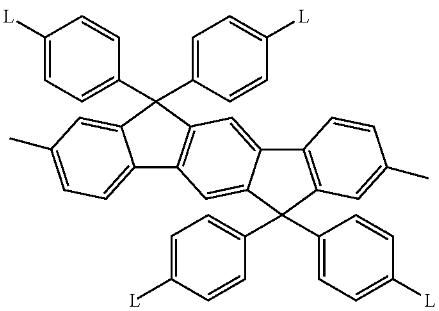

-continued

11d

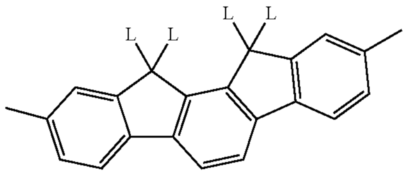

wherein

L is in each occurrence independently of one another selected from H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is in each occurrence independently of one another selected from optionally fluorinated, linear or branched alkyl or alkoxy with 1 to 12 C atoms, and is preferably n-octyl or n-octyloxy.

Further preferred electron transport units are those of formula 12 (phenanthrene derivatives), as disclosed for example in WO 2005/104264 A1:

12

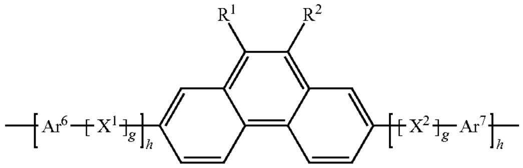

wherein $R^1$ and $R^2$ have independently of each other one of the meanings defined in formula 11, $X^1$ and $X^2$ are independently of each other —$CR^1$=$CR^1$—, —C≡C— or —N—$Ar^8$—

$Ar^{6-8}$ are in case of multiple occurrence independently of one another a bivalent aromatic or heteroaromatic ring system having from 2 to 40 C atoms, which is optionally substituted by one or more groups $R^1$ as defined in formula 11, g is in each occurrence independently of one another 0 or 1, h is in each occurrence independently of one another 0, 1 or 2.

The groups of formula 12 are preferably selected from the following sub-formulae:

12a

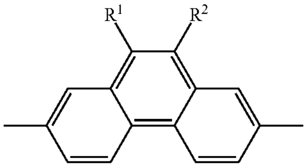

12b

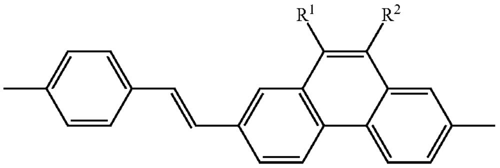

wherein $R^1$ and $R^2$ are as defined in formula 12, and are preferably alkyl or alkoxy with 1 to 12 C atoms or aryl or heteroaryl with 5 to 12 C atoms that is optionally substituted.

Further preferred electron transport units are those of formula 13 (dihydro-phenanthrene derivatives) as disclosed for example in WO 2005/014689 A2:

13

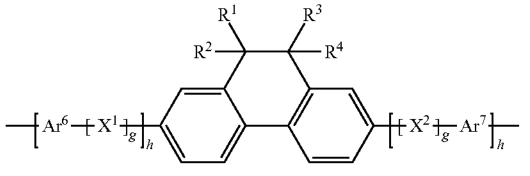

wherein $R^1$ and $R^2$ are as defined in formula 12, $R^3$ and $R^4$ have independently of each other one of the meanings of $R^1$ and $R^2$, and $Ar^{6,7}$, $X^{1,2}$, g and h are as defined in formula 12.

The groups of formula 13 are preferably selected from the following sub-formulae.

13a

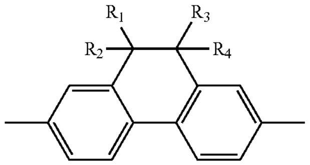

13b

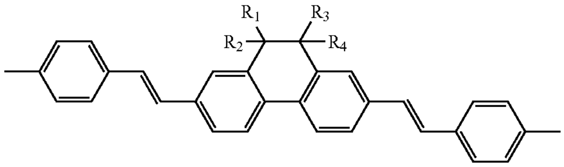

wherein $R^{1-4}$ are as defined in formula 13.

Further preferred electron transport units are those of formula 14, as disclosed for example in WO 2003/099901A1:

14

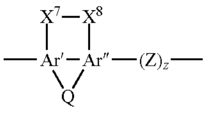

wherein

Ar' and Ar" denote an aromatic hydrocarbon group or heterocyclic group;

one of $X^7$ and $X^8$ denotes C(=O) or $C(R^1)(R^2)$ and the other denotes O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$, Q is $X^9$, $X^9$—$X^{10}$ or $X^{11}$=$X^{12}$, $X^9$ and $X^{10}$ denote independently of each other O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$, $X^{11}$ and $X^{12}$ denote independently of each other N, B, P, $C(R^1)$ or $Si(R^1)$, Z denotes —$CR^1$=$CR^2$— or —C≡C—, z is 0 or 1, $R^{1,2}$ are as defined in formula 11.

The groups of formula 14 are preferably selected from the following subformulae:

14a

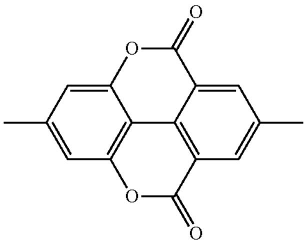

14a

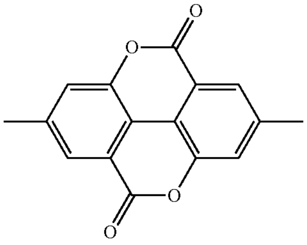

Further preferred electron transport units are selected from fluorene derivatives as disclosed for example in U.S. Pat. No. 5,962,631, WO 2006/052457 A2 and WO 2006/118345A1, spirobifluorene derivatives as disclosed for example in WO 03/020790 A1, and benzofluorene, dibenzofluorene, benzothiophene, dibenzofluorene and their derivatives as disclosed for example in WO2005/056633A1, EP1344788A1 and WO 2007/043495 A1.

Further preferred electron transport units are selected from anthracene, benzanthracene, ketone, imidazole, benzolimidazole, fluorene, spirobifluorene, triazine, pyridine, pyrimidine, pyridazine, pyrazine, oxadiazole, quinoline, quinoxaline, pyrene, perylene, phosphinoxide, phenazine, phenanthroline, triarylborane and derivatives thereof, all of which are optionally substituted.

If an electronic device of the present invention comprises one or more copolymers, these can be statistical or random copolymers, alternating or regioregular copolymers, block copolymers or combinations thereof. They can comprise two, three or more distinct monomer units.

Preferably an electronic device of the present invention comprises one or more copolymers having electron transport property, which are selected of the following formula

I $$\left(-(A)_x- \quad -(B)_y- \quad -(C)_v- \quad -(D)_w- \quad -(E)_z-\right)_n$$

wherein x, y, v, w and z denote the molar ratio of the monomers,

A, C, D, E are independently of each other an electron transport unit as defined above, preferably selected from formulae 11, 12, 13, 14 and their subformulae, B is a hole trap unit as defined above, preferably selected from formula 10 and its subformulae, X, v, w, z are independently of each other ≧0 and <1, with x+v+w+z being >0.96 and <1, very preferably x≠0 and w and/or z=0, y is >0 and <0.04, preferably from 0.01 to 0.03, very preferably from 0.01 to 0.02, x+y+v+w+z is 1, n is an integer >1.

Preferred copolymers of formula I are selected from the following subformulae of one or more monomeric hole trap compounds and one or more polymers or copolymers comprising, preferably consisting only of, one or more electron transport units, very preferably a polymer or copolymer comprising, most preferably consisting only of, electron transport polymer backbone units.

Ia

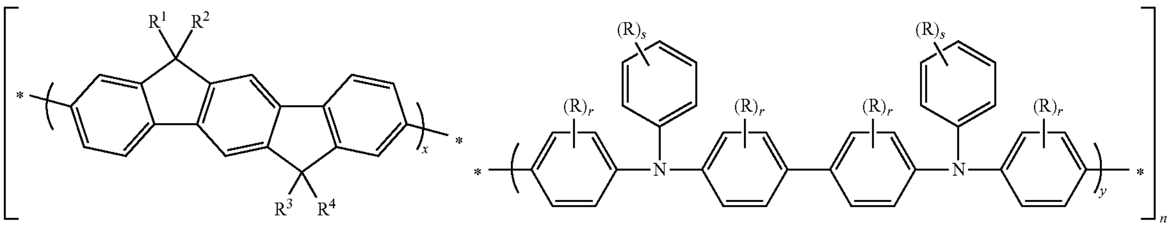

Ib

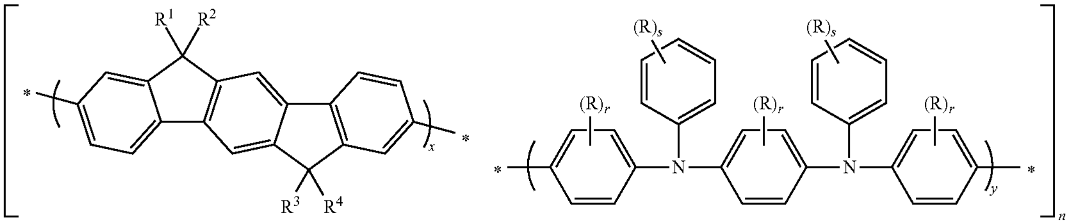

Ic

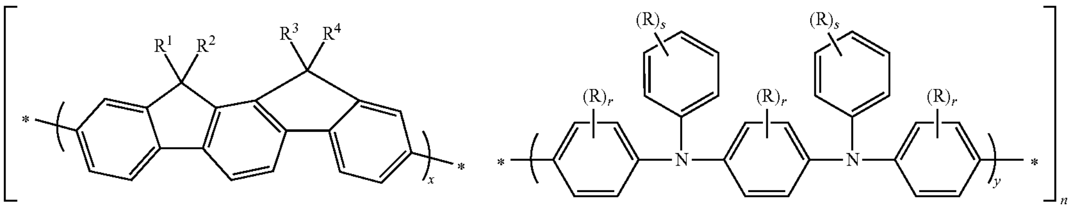

Id

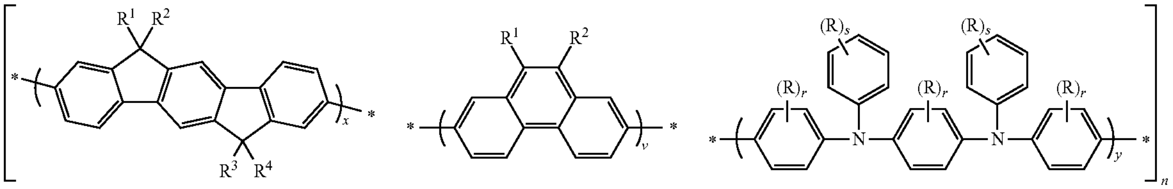

wherein $R^{1-4}$ are as defined in formula 13, R, r and s are as defined in formula 9a, and x, y, v and n are as defined in formula I above.

The content of a single electron transport unit, preferably selected of formula 11, 11a-d, 12, 12a, 13, 13a, 13b, 14, 14a or 14b in the copolymer is preferably from 1 to 99.9 mol %. The content of all electron transport units is preferably from 96 to 99.9 mol %.

The content of hole trap units, preferably selected of formula 10 or 10a-c, in the copolymer is preferably from 0.1 to 4 mol %, very preferably 1 to 3 mol %, most preferably 1 to 2 mol %.

In another preferred embodiment the electronic device comprises an organic functional material which is a mixture The polymer consisting only of electron transport units is preferably a copolymer of formula II:

II $$\left( -(A)_x- \quad -(C)_v- \quad -(D)_w- \quad -(E)_z- \right)_n$$

wherein x, v, w and z denote the molar ratio of the monomers,

A, C, D, E are independently of each other an electron transport unit as defined above, preferably selected from formulae 11, 12, 13, 14 and their subformulae, x, v, w, z are independently of each other ≧0 and ≦1, x+v+w+z is 1, n is an integer >1.

very preferably x and v≠0, most preferably x=v=0.5, and w=z=0.

Preferred copolymers of formula II are selected from the following subformula

IIa

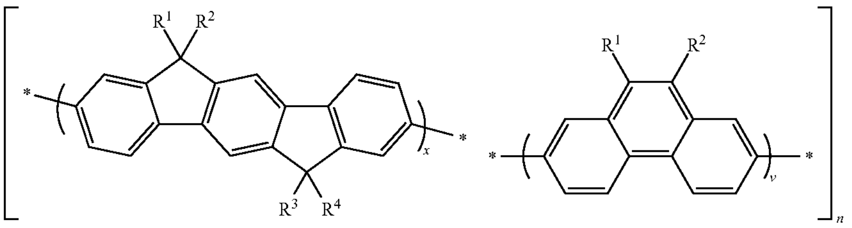

wherein $R^{1-4}$ are as defined in formula 13 and x, v and n are as defined in formula II.

The monomeric hole trap is preferably selected from compounds of formulae 9 and 9a-9c.

The electron transport (co)polymer preferably comprises one or more repeating units selected from units according to formulae 11, 11a-d, 12, 12a, 13, 13a, 13b, 14, 14a, 14b, or from units comprising one or more groups selected from anthracene, benzanthracene, ketone, imidazole, benzolimidazole, fluorene, spirobifluorene, benzofluorene, dibenzofluorene, benzothiophene, dibenzofluorene, triazine, pyridine, pyrimidine, pyridazine, pyrazine, oxadiazole, quinoline, quinoxaline, pyrene, perylene, phosphinoxide, phenazine, phenanthroline, triarylborane and derivatives thereof, all of which are optionally substituted.

In further preferred embodiment the electronic device comprises an organic functional material which is a mixture of one or more polymeric hole trap compounds, which comprise preferably one or more repeating units of formulae 10 or 10a-c, and one or more (co)polymers comprising electron transport units as described above.

In another preferred embodiment the electronic device comprises an organic functional material which is a mixture of one or more polymeric hole trap compounds, which comprise preferably one or more repeating units of formulae 10 or 10a-c, and one or more monomeric electron transport compounds as described above.

Attention should be taken to calculate the concentration in mol %. Especially if the organic function material comprises a copolymer and a monomeric compound, the exact concentration should be calculated based on the number of all repeating units. The concentration in wt % can be taken as a good approximation for the purposes of the present invention.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkynyl groups (especially ethynyl). Where the $C_1$-$C_{40}$ carbyl or hydrocarbyl group is acyclic, the group may be linear or branched.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkynyl, $C_3$-$C_{40}$ alkyl group, $C_4$-$C_{40}$ alkyldienyl, $C_4$-$C_{40}$ polyenyl, $C_6$-$C_{40}$ aryl, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkynyl, $C_3$-$C_{20}$ alkyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —COO—, —O—CO—O—, —S—CO—, —CO—S—, —$SO_2$—, —CO—$NR^0$—, —$NR^0$— CO—, —$NR^0$—CO—$NR^{00}$—, —$CX^1$=$CX^2$— or —C≡C— in such a manner that O and/or S atoms are not linked directly to one another, with $R^0$ and $R^{00}$ having one of the meanings given as described above and below and $X^1$ and $X^2$ being independently of each other H, F, Cl or CN.

$R^0$ and $R^{00}$ are preferably selected from H, straight-chain or branched alkyl with 1 to 12 C atoms or aryl with 6 to 12 C atoms.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-i-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substitutents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature (Tg) of the polymer such as bulky groups, e.g. tert-butyl or optionally substituted aryl groups.

Preferred substituents include, without limitation, F, Cl, Br, I, —CN, —$NO_2$, —NCO, —NCS, —OCN, —SCN, —C(═O)$NR^0R^{00}$, —C(═O)X, —C(═O)$R^0$, —$NR^0R^{00}$, wherein $R^0$, $R^{00}$ and X are as defined above, optionally substituted silyl, aryl with 4 to 40, preferably 6 to 20 C atoms, and straight chain or branched alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl.

In the (co)polymers used in the electronic device according to the present invention, the number of repeating units n is preferably from 10 to 10,000, very preferably from 50 to 5,000, most preferably from 50 to 2,000.

The (co)polymers used in the electronic device of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the (co)polymers of the present invention can be prepared according to suitable methods which are known to the expert and have been disclosed in the literature. Suitable and preferred methods for the preparation of indenofluorene monomers are described for example in WO 2004/041901 and EP2004006721. Suitable and preferred methods for the preparation of triarylamine monomers are described for example in WO 99/54385.

Preferably the (co)polymers are prepared from monomers comprising one of the above mentioned groups, which are linked to two polymerisable groups P. Accordingly, for example the indenofluorene monomers are selected of the following formula

IA

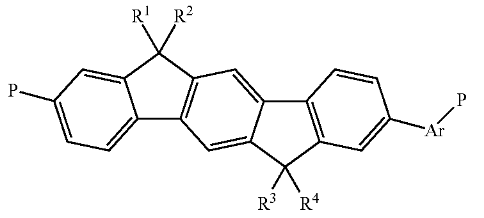

wherein P is a polymerisable group and Ar, $R^{1-4}$ are as defined above. The other co-monomers, like e.g. triarylamine monomers, are built accordingly.

Preferably the groups P are independently of each other selected from Cl, Br, I, O-tosylate, O-triflate, O-mesylate, O-nonaflate, $SiMe_2F$, $SiMeF_2$, O—$SO_2Z$, $B(OZ^1)_2$, —$CZ^2$═$C(Z^2)_2$, —C≡CH and $Sn(Z^3)_3$, wherein Z and $Z^{1-3}$ are selected from the group consisting of alkyl and aryl, each being optionally substituted, and two groups $Z^1$ may also form a cyclic group.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, a monomer as described above having two reactive halide groups P is preferably used. When synthesizing a linear polymer by Suzuki polymerisation, preferably a monomer as described above is used wherein at least one reactive group P is a boron derivative group.

Suzuki polymerisation may be used to prepare regioregular, block and random copolymers. In particular, random copolymers may be prepared from the above monomers wherein one reactive group P is halogen and the other reactive group P is a boron derivative group. Alternatively, block or regioregular copolymers, in particular AB copolymers, may be prepared from a first and a second of the above monomers wherein both reactive groups of the first monomer are boron and both reactive groups of the second monomer are halide. The synthesis of block copolymers is described in detail for example in WO 2005/014688 A2.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o\text{-}Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula $—O—SO_2Z$ can be used wherein Z is as described above. Particular examples of such leaving groups are tosylate, mesylate and triflate.

In a preferred embodiment of the present invention, the electronic device comprises an additional charge generation layer (CGL) provided between the electrode and the functional layer, which can generate free charge carriers under an applied electric field upon the physical excitation, for example optical, thermal or electromagnetic excitation.

Preferably the electronic device is a photoreceptor, electrophotographic or xerographic device, which works upon optical excitation.

The organic material of the present invention is typically processed in the device to form an organic layer or film, preferably less than 200 microns thick. Typically the layer is at most 1 micron (=1 μm) thick, although it may be thicker if required. For various electronic device applications, the thickness may range from less than about 1 micron to several tens micron thick. For use in an electrophotographic device, the layer thickness is preferably from 10 to 100 microns.

A typical single-layer photoreceptor for electrophotographic application according to the present invention is shown in FIG. 1, comprising:

contact to ground (1), a metalised substrate (2) as electrode, e.g. a metal coated glass or plastic substrate, preferably the metal is Al, a charge transport layer (4) (CTL)

wherein the CTL (4) comprises an organic functional material or copolymer as described above and below.

Figure 2:
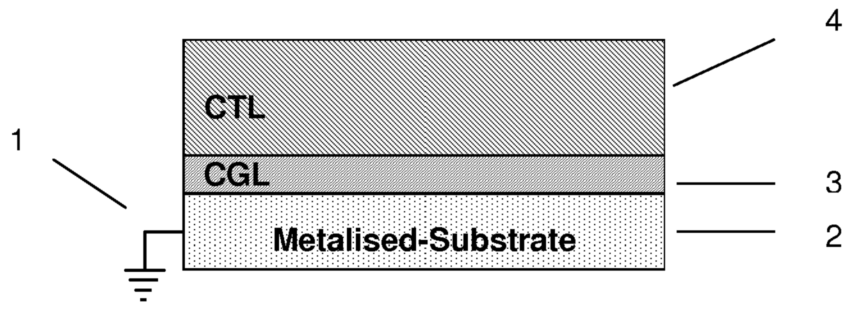
FIG. 2 exemplarily shows a double-layer electrophotographic device according to the present invention.

A typical double-layer photoreceptor for electrophotographic application according to the present invention is shown in FIG. 2, comprising:

contact to ground (1), a metalised substrate (2) as electrode, e.g. a metal coated glass or plastic substrate, preferably the metal is Al, a charge generation layer (3) (CGL), a charge transport layer (4) (CTL)

wherein the CTL (4) comprises an organic functional material or copolymer as described above and below.

The standard device components and suitable materials and methods their manufacture are known from the literature and described for example in Paul M. Borsenberger; David S. Weiss *Organic Photorecptors for Xerography*; Marcel Dekker, Inc., 1998, and K. Y. Law, Chem. Rev. Vol 93, 449-486 (1993), The CGL is required to generate free charge carrier efficiently upon illumination, thus to comprise charge generation material (CGM) having strong absorption at the desired wavelength and high dissociation probability of the exciton. In general, the polymers suitable for organic solar cells, as summarized for example by F. C. Krebs, in Solar Energy Materials and Solar Cells, Vol 91, pp 953 (2007), or dyes for dye-sensitized solar cells, for example ruthenium complexes as disclosed by Yu Bai et. al., in Nature Materials, Vol 7, pp 626 (2008) and by B. O'Regan et. al., in Nature 353, 737 (1991), are also suitable for a CGM in the present invention. Preferably, the CGM is selected from AZO, phthalocaynines, including metal-free phthalocaynines, donor or accepotor doped metal-free phthalocaynines and metal phthalocyanines, porphyrins, squaraine, perylene pigments as summarized by Paul M. Borsenberger; David S. Weiss *Organic Photorecptors for Xerography*; Marcel Dekker, Inc., 1998, Chapter 6, and K. Y. Law, Chem. Rev. Vol 93, 449-486 (1993); Further preferable polymeric CGMs are selected from popolysilanes, polygermanes, polymer (N-vinylcarbazole) (PVK) and related compounds, triphenylamine and tri-tolyamine doped polymers, and PVK-TNF (trinitrofluorenone) charge-transfer complex. Further preferable CGMs are selected from organic compounds containing fused ring system, for example anthracene, naphthalene, pentacene and tetracene derivatives.

For deposition in double-layer photoreceptors, the CGM is preferably dissolved or dispersed in a solvent that is orthogonal to the solvent used for deposition of the CTM. Furthermore, an additive polymer is preferably added to the solution or dispersion to improve the mechanical and film formation properties.

In a second aspect the present invention relates to a second non-electroluminescent electronic device comprising:

an electrode, a counter electrode, a functional layer having charge transport property and being provided between said electrode and said counter electrode, wherein said functional layer comprises a functional material as described above and below for the first electronic device.

Preferably said second non-electroluminescent electronic device comprises a charge generation layer between the functional layer and any of the electrodes.

Further preferably said second non-electroluminescent electronic device is an organic solar cell or dye-sensitized solar cell (DSSC). A typical DSSC structure comprises, in this sequence, a transparent electrode, a dye-sensitized layer (CGL), a charge transport media, and a counter electrode (see e.g. U. Bach et al., Nature 395, 583-585 (1998)).

Further preferably said second non-electroluminescent electronic device is a field quench device. A typical field quench device comprises, in this sequence, an electrode, a functional layer comprising a photo-luminescent or electroluminescent material, and a counter electrode, wherein the photoluminescence or electroluminescence from the function layer is controllably quenched by applying an external electric field through the electrodes, as disclosed for example in US 2004-017148 A1.

Further preferably said second non-electroluminescent electronic device is a spintronic device. In general, a spintronic device is any device which can manipulate the spin of the electron, and/or transport and/or store electron with specific spin, and/or detect the spin state of the electron. In the present invention, the spintronic device is preferably related to an organic spin valve. One typical structure of an organic spin valve comprises two ferromagnetic electrodes and an organic layer between the two ferromagnetic electrodes (see Z. H. Xiong et al., in Nature 2004 Vol 427 pp 821). Preferably at least one of the organic layers comprises a copolymer as described above and below and the ferromagnetic electrode is composed of Co, Ni, Fe, or alloys thereof, or $ReMnO_3$ or $CrO_2$, wherein Re is rare earth element.

A third aspect of the present invention relates to an organic functional material which is a mixture of one or more organic compounds having hole trap function and one or more organic compounds having electron transport function, wherein at least one of the hole trap and electron transport compounds is a monomeric compound, and wherein the HOMO of the hole trap compound is at least 0.3 eV, preferably 0.4 eV and very preferably 0.5 eV higher than the HOMO of the electron transport compound, and the concentration of the hole trap compound in the organic functional material is 4 mol %, preferably from 0.1 to 4 mol %, more preferably from 1 to 3 mol %, and very preferably from 1 to 2 mol %.

In a preferred embodiment both the hole trap compounds and electron transport compounds are monomeric compounds as described above.

In another preferred embodiment the organic functional material is a mixture of one or more monomeric hole trap compounds and one or more polymeric electron transport compounds as described above.

In another preferred embodiment the mixture comprises both polymeric hole trap compounds and electron transport compounds as described above.

In another preferred embodiment the organic functional material is a mixture of one or more polymeric hole trap compounds and one or more monomeric electron transport compounds as described above.

A fourth aspect of the invention relates to a formulation, preferably a solution, comprising an organic functional material, which is a mixture of one or more organic compounds having hole trap function and one or more organic compounds having electron transport function as described above and below, and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

The concentration of the organic material in the solution is preferably 0.1 to 10% by weight, more preferably 0.5 to 5% by weight.

For use as functional layer the organic material of the present invention may be deposited by any suitable method. Liquid coating of organic electronic devices such as organic photoreceptors and field effect transistors is more desirable than vacuum deposition techniques. Solution deposition methods are especially preferred. Preferred deposition techniques include, without limitation, spray coating, dip coating, spin coating, ink jet printing, letter-press printing, screen printing, doctor blade coating, roller printing, reverse-roller printing, offset lithography printing, flexographic printing, web printing, brush coating, pad printing or slot-die coating. Spray coating and dip coating are particularly preferred for organic photoreceptors as they allow high materials usage, high put-through for thick devices.

The organic material or formulation according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

Another aspect of the invention relates to the use of an organic functional material as described above and below in an electronic device as described above and below.

Another aspect of the invention relates to the use of an formulation as described above to manufacture an electronic device as described above and below.

A further aspect of the invention relates to an electronic device comprising an organic functional material as described above and below The electronic device includes, without limitation, organic field effect transistors (OFET), thin film transistors (TFT), organic integrated circuits, radio frequency identification (RFID) tags, sensors, logic circuits, memory elements, capacitors, charge injection layers, Schottky diodes, planarising layers, antistatic films, conducting substrates or patterns, photodetectors, photoconductors, electrophotographic devices, xerographic devices, organic solar cells, dye-sensitized solar cells, organic spintronic devices, field-quench devices and organic plasmon-emitting devices (OPED).

Unless the context clearly indicates otherwise, as used herein plural forms of the terms herein are to be construed as including the singular form and vice versa.

Throughout the description and claims of this specification, the words “comprise” and “contain” and variations of the words, for example “comprising” and “comprises”, mean “including but not limited to”, and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless stated otherwise, all specific values of physical parameters like photoinduced-discharge curves, dark decay curves, quantum yield of photogeneration of free charge carriers, as given above and below refer to a temperature of 25° C. (+/−1° C.). Ratios of monomers or repeating units in polymers are given in mol %. The molecular weight of polymers is given as weight average molecular weight $M_W$ (GPC, polystyrene standard).

Unless stated otherwise, the concentration of a specific monomeric or polymeric compound, like for example a hole trap or electron transport compound, in a functional organic material as described above and below (given in mol % or wt. %), refers to the total amount of solids in the material, i.e. without solvents.

The invention will now be described in more detail by reference to the following examples, which are illustrative only and do not limit the scope of the invention.

EXAMPLE 1

Polymer 1 is an alternating copolymer of the following monomers (mol %), that can be synthesized by Suzuki coupling as described in WO2003/048225 A1:

M1

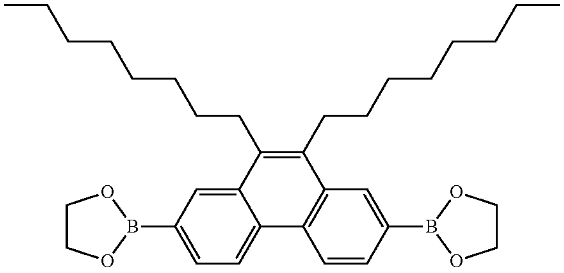

50%

M2

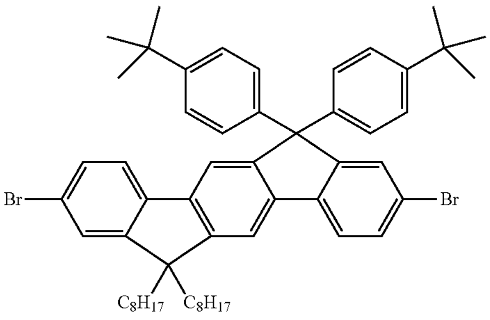

50%

Polymer 2 is a copolymer consisting of the following monomers (mol %), that can be synthesized by Suzuki coupling as described in WO2003/048225 A1:

M1

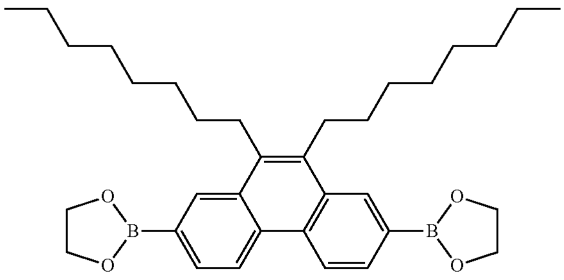

50%

-continued

M2

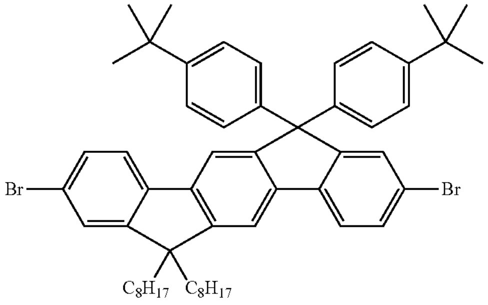

48%

M3

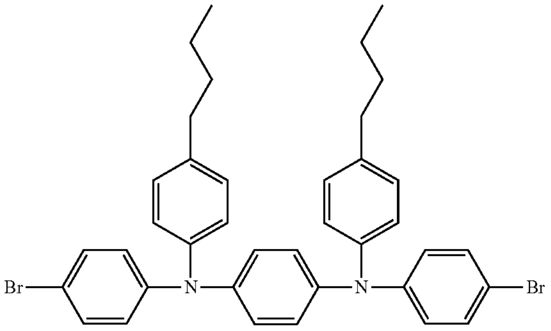

2%

Polymer 1 does not contain a hole trap unit in the sense of the present invention. Polymer 2 contains unit M3 with hole trap property, and can therefore be used as electron transport and hole trap copolymer in an organic functional material according to the present invention.

EXAMPLE 2

SM1 is a monomeric electron transport compound and SM2a monomeric hole trap compound as shown below:

SM1

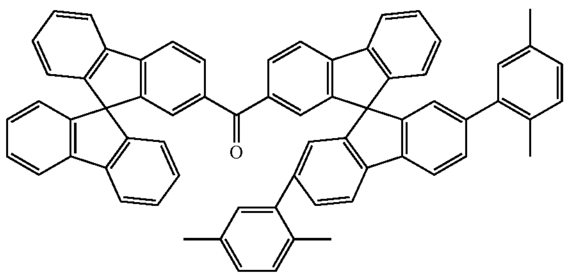

-continued

SM2

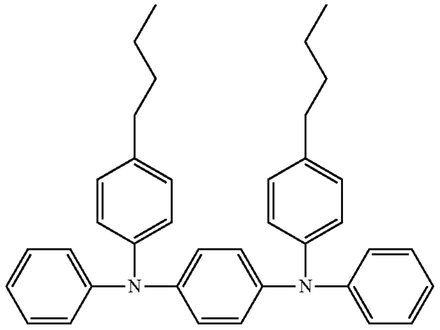

EXAMPLE 3

A dispersion comprising 4.2% CGM, 1.8% Polyvinylbutyral, 47% Ethylacetat and 47% Butylacetat is received from Sensient Imaging Technologies GmbH Germany, and used as received, wherein "CGM" is a charge generation material of the following formula (Y—TiO-Phthalocyanine complex="Y—TiOPc"):

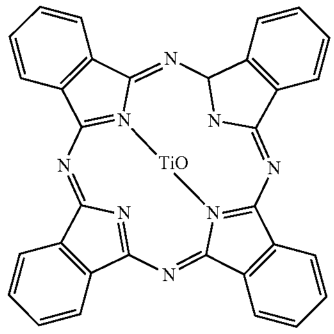

The dispersion can be used in the charge generation layer (CGL) of an electrophotographic device.

EXAMPLE 4

Cyclovoltametry Measurements on Polymer 2

Figure 3:
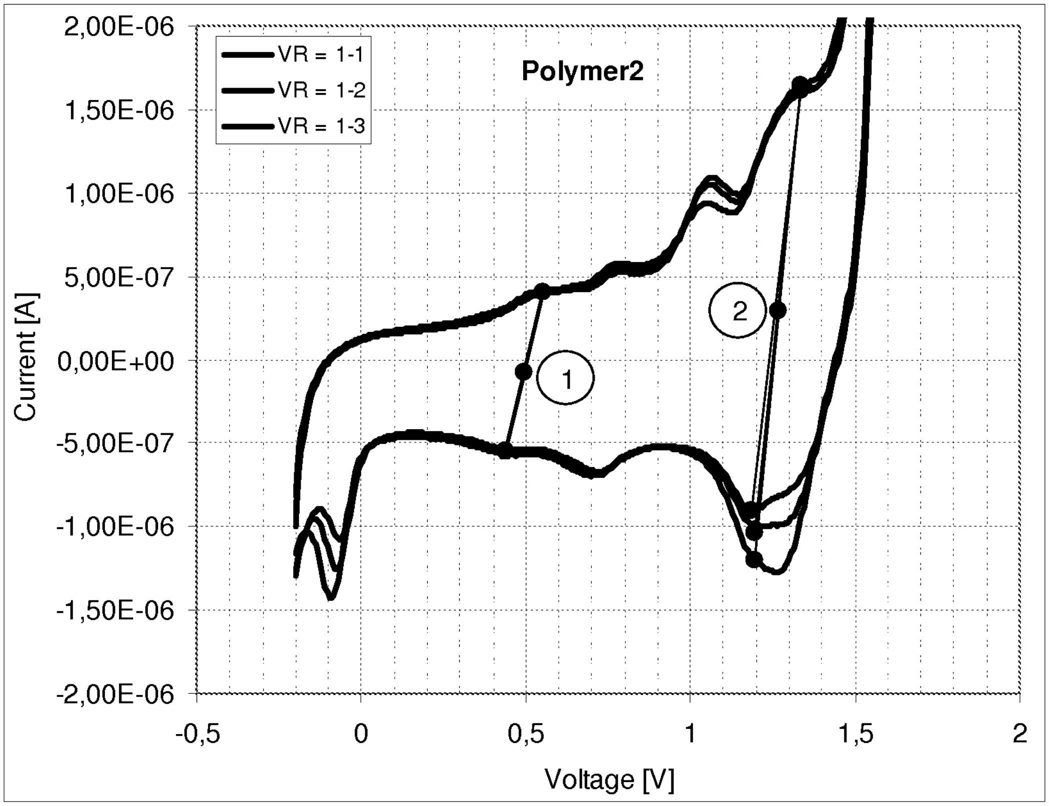
FIG. 3 shows the oxiduction curves of a polymer according to Example 2 of the present invention obtained by cyclovoltametry measurements.

Cyclovoltametry (CV) measurements were conducted on Polymer 2 of Example 1 to determine the HOMOs of the corresponding units. Details on CV measurements are disclosed in WO 2008/011953 A1. FIG. 3 shows the oxiduction curves of Polymer 2. From peak 1a HOMO level can be determined to be about −4.89 eV which is corresponding the hole trap unit in the polymer (M1-M3-M1 in DFT calculation), and from peak 2 another HOMO level can be determined to be −5.60 eV, corresponding to the electron transport backbone (M1-M2-M1 in DFT calculation).

EXAMPLE 5

Quantum Simulation on Enemy Levels of Polymers 1 &2 and SM1 &2

The HOMO levels of organic functional materials are calculated by Gaussian 03W using the DFT method. For conjugated polymers, the trimer is used for calculated the corresponding function units, for example M1-M2-M1 is taken as electron transport unit for Polymer 1 and Polymer 2 and M1-M3-M1 as hole trap unit in Polymer 2. The results for the polymers are summarised in table 1. An excellent agreement between CV and DFT calculation can be found, which further clearly indicates that M3 is a hole trap monomer according the present invention.

TABLE 1

| Trimer | Function in polymer | DFT Homo Corr. | CV HOMO |
|---|---|---|---|
| M1-M3-M1 | Hole trap | −4.94 | −4.89 |
| M1-M2-M1 | Electron transport | −5.56 | −5.60 |

The results of the DFT calculation on SM1 & SM2 are summarised in table 2, which clearly indicate that SM2 is a hole trap in an SM1 matrix or in a polymeric matrix of Polymer 1 according to the present invention.

TABLE 2

| Compound | DFT HOMO Corr. [eV] |
|---|---|
| SM1 | −5.85 |
| SM2 | 4.94 |

EXAMPLE 6

Device Preparation

A double-layer electrophotographic device with a structure as shown in FIG. 2 is prepared as follows:

1) An electrode is prepared by evaporating a 200 nm Al layer on a glass substrate;
2) A CGL is prepared by coating a 150-200 nm layer of the TiOPc dispersion of Example 1 on the Al electrode and then heated for 10 minutes at 180° C. to remove the residual solvents;
3) A CTL is prepared by coating a solution of the organic functional material as listed in table 3 for different devices (30 mg/ml) in toluene by doctor blade technique onto the Y—TiOPc layer and heated for 60 minutes at 180° C. to remove the residual solvent. A layer thickness of about 10 μm is obtained.

TABLE 3

| | CTL |
|---|---|
| Device 1 | 100% Polymer 1 |
| Device 2 | 100% Polymer 2 |
| Device 3 | 100% SM1 |
| Device 4 | SM1 + 2 wt. % SM2 |
| Device 5 | Polymer 1 + 2 wt. % SM2 |
| Device 6 | SM1 + 6 wt. % SM2 |

EXAMPLE 7

Electrophotography Measurements

The details of electrophotographic setup and measurements are also described elsewhere by Pan et al., J. Chem. Phys. (2000) Vol. 112, pp 4305: The dark-adapted devices with its electrode grounded is charged positively by a Corona charger to a certain surface potential. The device is then exposed to monochromatic radiation incident on the free surface. The exposure is realized using a setup consisting of a monochromator equipped with a 150W Xenon lamp. The surface potential is measured by a non-contact electrostatic voltmeter. By xerographic measurements the so-called photo-induced discharge curve (PIDC) is recorded, and the dark decay arte and the photogeneration efficiency ϕ can be calculated from PIDCs, as described in more details in J. Chem. Phys. (2000) Vol. 112, pp 4305.

The results are summarized in table 4, where the dark decay rate is recorded at an initial surface potential of about 250V, and the photogeneration quantum efficiency is calculated at an illumination wavelength of 650 nm and an electric field of about $2\times10^7$ V/M.

Devices 1 and 3, which do not contain an organic functional material comprising a hole trap unit or a hole trap compound according to the present invention, show a very high dark decay rate, and photogeneration efficiency cannot be calculated.

Devices 2, 4 and 5, which contain an organic functional material comprising a hole trap unit or a hole trap compound at a concentration according to the present invention, show a low dark decay rate and reasonable photogeneration quantum efficiency at the illumination wavelength at 670 nm. The performance can be further improved by device optimization.

Device 6, which contains the hole trap compound SM2, but with a concentration of more than 4 wt %, shows remarkably decreasing performance in comparison with Device 4, which contains hole trap compound SM2 in a concentration of less than 4 wt % in accordance with the present invention.

TABLE 4

| | CTL | Dark decay rate [V/s] | Photogeneration efficiency [%] |
|---|---|---|---|
| Device 1 | 100% Polymer 1 | 55.2 | n.d. |
| Device 2 | 100% Polymer 2 | 11.3 | 4.3 |
| Device 3 | 100% SM1 | >60 | n.d. |
| Device 4 | SM1 + 2 wt. % SM2 | 22.4 | 3.9 |
| Device 5 | Polymer 1 + 2 wt. % SM2 | 15.5 | 3.2 |
| Device 6 | SM1 + 6 wt. % SM2 | 39.6 | 1.2 |

The invention claimed is:

1. An electronic device comprising an electrode, a functional layer having charge transport property and being provided on the electrode, wherein the functional layer comprises a functional material comprising an electron transport component and a hole trap component, wherein the HOMO (highest occupied molecular orbital) of the hole trap component is at least 0.3eV higher than the HOMO of the electron transport component, and the concentration of the hole trap component in the functional material is ≦4 mol %, said electronic device being non-electroluminescent.

2. A device according to claim 1, wherein the hole trap component has a HOMO ≧0.4eV than the HOMO of the electron transport component.

3. A device according to claim 1 wherein the hole trap component has a HOMO ≧0.5eV than the HOMO of the electron transport component.

4. A device according to claim 1, wherein the concentration of the hole trap component in the functional material is from 0.1 to 4 mol %.

5. A device according to claim 1, wherein the said functional material is a mixture comprising two or more compounds, one or more of which are electron transport compounds and one or more of which are hole trap compounds.

6. A device according to claim 5, wherein at least one of the electron transport compounds or the hole trap compounds are monomeric compounds.

7. A device according to claim 6, wherein at least the hole trap compounds are monomeric compounds.

8. A device according to claim 1, wherein the functional material comprises a monomeric hole trap compound of the following formula:

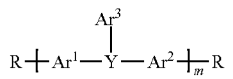

9 wherein

Y is N, P, P═O, $PF_2$, P═S, As, As═O, As═S, Sb, Sb═O or Sb═S, preferably N, $Ar^1$ which may be the same or different, denote, independently if in different repeat units, a single bond or an optionally substituted mononuclear or polynuclear aryl or heteroaryl group, $Ar^2$ which may be the same or different, denote, independently if in different repeat units, an optionally substituted mononuclear or polynuclear aryl or heteroaryl group, $Ar^3$ which may be the same or different, denote, independently if in different repeat units, an optionally substituted mononuclear or polynuclear aryl or heteroaryl group, m is 1, 2 or 3, and R which may be the same or different, is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group.

9. A device according to claim 8, wherein the functional material comprises a monomeric hole trap compound of the following formulae:

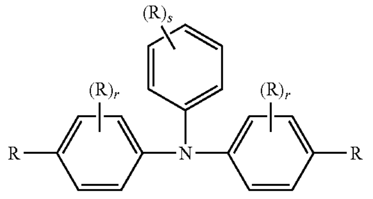

9a

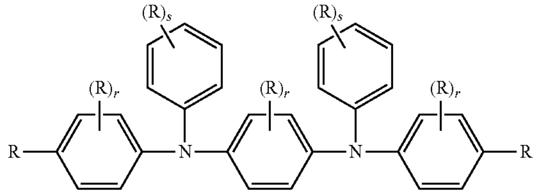

9b

-continued

9c

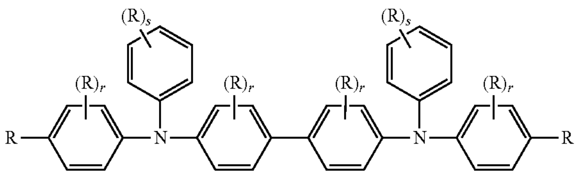

wherein R is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group, r is 0, 1, 2, 3 or 4 and s is 0, 1, 2, 3, 4 or 5.

10. A device according to claim 1, wherein the functional material comprises one or more electron transport compounds comprising one or more anthracene, benzanthracene, ketone, imidazole, benzolimidazole, phenanthrene, dehydrophenanthrene, fluorene, indenofluorene, spirobifluorene, triazine, pyridine, pyrimidine, pyridazine, pyrazine, oxadiazole, quinoline, quinoxaline, pyrene, perylene, phosphinoxide, phenazine, phenanthroline or triarylborane moieties or derivatives thereof, all of which are optionally substituted.

11. A device according to claim 1, wherein at least one of the electron transport compounds and the hole trap compounds are polymeric compounds.

12. A device according to claim 11, wherein at least the electron transport compounds are polymeric compounds.

13. A device according to claim 1, wherein the functional material is or comprises a copolymer comprising two or more different repeating units, one or more of which are electron transport units and one or more of which are hole trap units.

14. A device according to claim 11, wherein the polymeric hole trap compound or copolymer comprises a hole trap unit of the following formula:

10

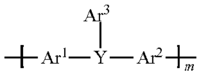

wherein

Y is N, P, P═O, $PF_2$, P═S, As, As═O, As═S, Sb, Sb═O or Sb═S, preferably N, $Ar^1$ which may be the same or different, denote, independently if in different repeat units, a single bond or an optionally substituted mononuclear or polynuclear aryl or heteroaryl group, $Ar^2$ which may be the same or different, denote, independently if in different repeat units, an optionally substituted mononuclear or polynuclear aryl or heteroaryl group, $Ar^3$ which may be the same or different, denote, independently if in different repeat units, an optionally substituted mononuclear or polynuclear aryl or heteroaryl group, m is 1, 2 or 3, and R which may be the same or different, is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group.

15. A device according to claim 14, wherein the hole trap unit is

10a

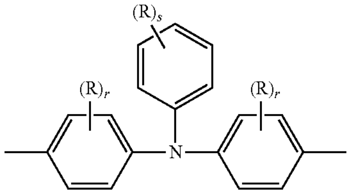

10b

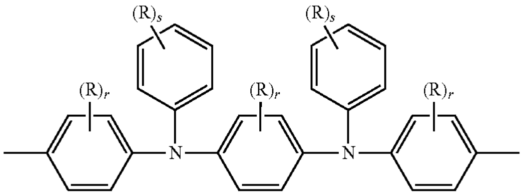

10c

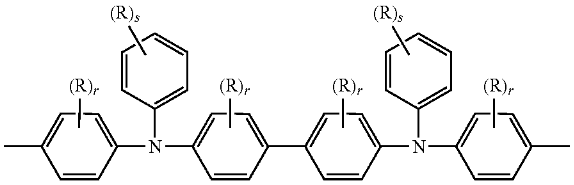

wherein R is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group, r is 0, 1, 2, 3 or 4 and s is 0, 1, 2, 3, 4 or 5.

16. A device according to claim 11, wherein the polymeric electron transport compound or copolymer comprises one or more electron transport units of the following formula

11

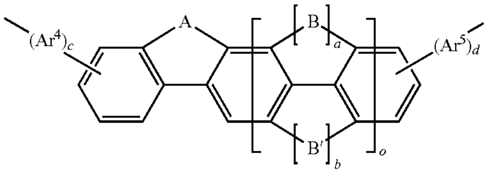

wherein

A, B and B' are independently of each other, and in case of multiple occurrence independently of one another, a divalent group —$CR^1R^2$—, —$NR^1$—, —$PR^1$—, —O—, —S—, —SO—, —$SO_2$—, —CO—, —CS—, —CSe—, —P(═O)$R^1$—, —P(═S)$R^1$— and —$SiR^1R^2$—, $R^1$ and $R^2$ are independently of each other identical or different groups H, halogen, —CN, —NC, —NCO, —NCS, —OCN, —SCN, —C(═O)$NR^0R^{00}$, —C(═O)X, —C(═O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally containing one or more hetero atoms, each a is independently one of 0 and 1 and each corresponding b in the same unit is the other of 0 and 1, o is an integer≧1, $Ar^4$ and $Ar^5$ are independently of each other mono- or polynuclear aryl or heterorary1 that is optionally substituted and optionally fused to the 7,8-positions or 8,9-positions of the indenofluorene group, c and d are independently of each other 0 or 1.

17. A device according to claim 11, wherein the polymeric electron transport compound or copolymer comprises one or more electron transport units of the following formula

12

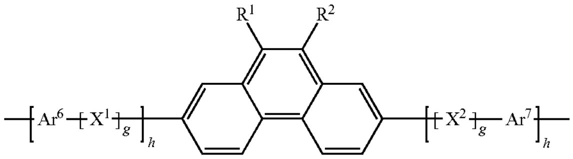

wherein $R^1$ and $R^2$ are independently of each other identical or different groups H, halogen, —CN, —NC, —NCO, —NCS, —OCN, —SCN, —C(═O)NR$^0$R$^{00}$, —C(═O)X, —C(═O)R$^0$, —NH$_2$, —NR$^0$R$^{00}$, —SH, —SR$^0$, —SO$_3$H, —SO$_2$R$^0$, —OH, —NO$_2$ —CF$_3$, —SF$_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, $X^1$ and $X^2$ are independently of each other —CR$^1$═CR$^1$—, —C≡C— or —N—Ar$^8$—, $Ar^{6-8}$ are in case of multiple occurrence independently of one another a bivalent aromatic or heteroaromatic ring system having from 2 to 40 C atoms, which is optionally substituted by one or more groups $R^1$, g is in each occurrence independently of one another 0 or 1, h is in each occurrence independently of one another 0, 1 or 2.

18. A device according to claim 11, wherein the polymeric electron transport compound or copolymer comprises one or more electron transport units of the following formula

13

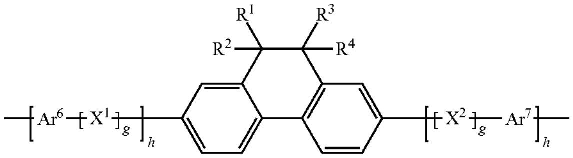

$R^1$ and $R^2$ are independently of each other identical or different groups H, halogen, —CN, —NC, —NCO, —NCS, —OCN, —SCN, —C(═O)NR$^0$R$^{00}$, —C(═O)X, —C(═O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, $R^3$ and $R^4$ have independently of each other one of the meanings of $R^1$ and $R^2$, and $Ar^{6,7}$ are in case of multiple occurrence independently of one another a bivalent aromatic or heteroaromatic ring system having from 2 to 40 C atoms, which is optionally substituted by one or more groups $R^1$, $X^{1.2}$ are independently of each other —CR$^1$═CR$^1$—, —C≡C— or —N—Ar$^8$—, g is each independently 0 or 1 and h is each independently 0-2.

19. A device according to claim 11, wherein the polymeric electron transport compound or copolymer comprises an electron transport unit comprising one or more anthracene, benzanthracene, ketone, imidazole, benzolimidazole, phenanthrene, dehydrophenanthrene, fluorene, indenofluorene, spirobifluorene, triazine, pyridine, pyrimidine, pyridazine, pyrazine, oxadiazole, quinoline, quinoxaline, pyrene, perylene, phosphinoxide, phenazine, phenanthroline or triarylborane moieties or derivatives thereof, all of which are optionally substituted.

20. A device according to claim 16, wherein the polymeric electron transport compound or copolymer is a copolymer of the following formula $$\left( -(A)_x- \quad -(B)_y- \quad -(C)_v- \quad -(D)_w- \quad -(E)_z- \right)_n \qquad \text{I}$$

wherein

A, C, D, E are independently of each other an electron transport unit as defined for formula 11, B is a hole trap unit of formula 10,

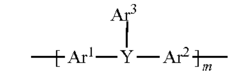

wherein

Y is N, P, P═O, PF$_2$, P═S, As, As═O, As═S, Sb, Sb═O or Sb═S, preferably N, $Ar^1$ which may be the same or different, denote, independently if in different repeat units, a single bond or an optionally substituted mononuclear or polynuclear aryl or heteroaryl group, $Ar^2$ which may be the same or different, denote, independently if in different repeat units, an optionally substituted mononuclear or polynuclear aryl or heteroaryl group, $Ar^3$ which may be the same or different, denote, independently if in different repeat units, an optionally substituted mononuclear or polynuclear aryl or heteroaryl group, m is 1, 2 or 3, and R which may be the same or different, is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group, x, v, w, z are independently of each other ≧0 and <1, with x+v+w+z being >0,96 and <1, y is >0 and <0,04, x+y+v+w+z is 1, n is an integer >1.

21. A device according to claim 20, wherein the copolymer of formula I is Ia

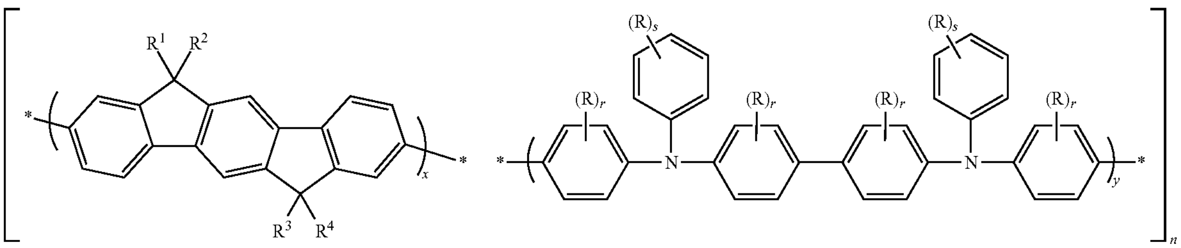

Ib

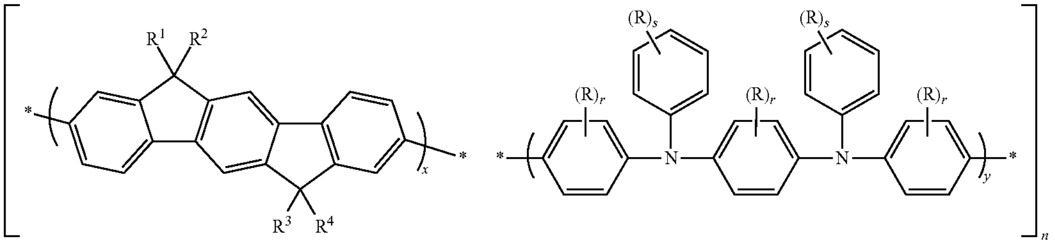

Ic

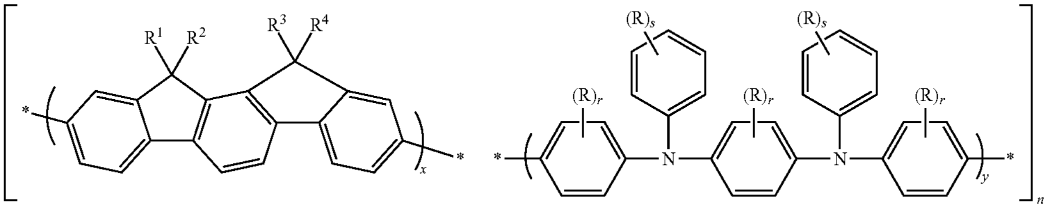

or

Id

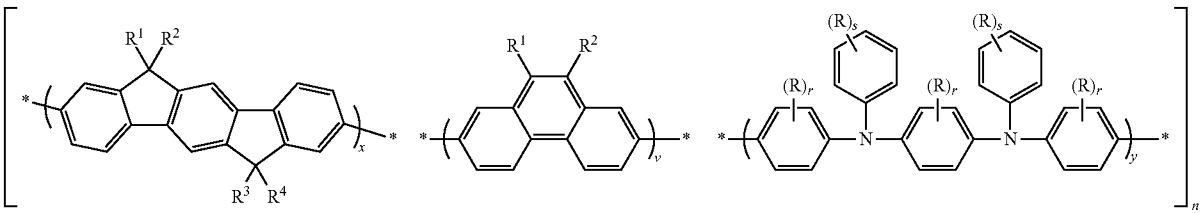

wherein $R^{1-4}$ are as defined for formula 13, R, r and s are defined R is H, substituted or unsubstituted aromatic or heteroaromtic group, alkyl, cycloalkyl,alkoxy, aralkyl, aryloxy, arylthio, alkoxycarbonyl, silyl, carboxy group, a halogen atom, cyano group, nitro group or hydroxy group, r is 0, 1, 2, 3 or 4 and s is 0, 1, 2, 3, 4 or 5 and x, y, v and n are as defined for formula I.

22. A device according to claim 1, wherein the functional material is a mixture comprising an electron transport copolymer of formula II:

II $$\left( -(A)_x- \quad -(C)_v- \quad -(D)_w- \quad -(E)_z- \right)_n$$

wherein

A, C, D, E are independently of each other an electron transport unit of formula 11,

11

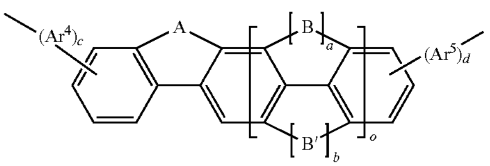

wherein

A, B and B' are independently of each other, and in case of multiple occurrence independently of one another, a divalent group —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$— and —$SiR^1R^2$—, $R^1$ and $R^2$ are independently of each other identical or different groups H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally containing one or more hetero atoms, each a is independently one of 0 and 1 and each corresponding b in the same unit is the other of 0 and 1, o is an integer ≧1, $Ar^4$ and $Ar^5$ are independently of each other mono- or polynuclear aryl or heteroraryl that is optionally substituted and optionally fused to the 7,8-positions or 8,9-positions of the indenofluorene group, c and d are independently of each other 0 or 1, x, v, w, z are independently of each other ≧0 and ≦1, x+v+w+z is 1, n is an integer >1.

23. A device according to claim 1, wherein the functional layer is a charge transport layer or both electron transport and photogeneration layer.

24. A device according to claim 23, wherein the functional layer is an electron transport layer.

25. A device according to claim 1, wherein the functional layer is a charge transport layer and wherein the device further comprises a charge generation layer between the electrode and the said charge transport layer.

26. A device according to claim 1, which is an electrophotographic or xerographic device.

27. A non-electroluminescent electronic device according to claim 1 comprising an electrode, a counter electrode, and a functional layer having charge transport property and being provided between the electrodes, wherein the functional layer comprises a functional material as defined in claim 1.

28. A non-electroluminescent electronic device according to claim 27, which is an organic solar cell, dye-sensitized solar cell, organic spintronic device, field-quench device, photodetector or sensor.

29. A mixture comprising one or more electron transport compounds and one or more hole trap compounds as defined in claim 1, wherein at least one of the electron transport compounds and hole trap compounds is a monomeric compound.

30. A formulation comprising a mixture according to claim 29 and one or more organic solvents.

31. An electronic device comprising a mixture or formulation according to claim 29.

32. An electronic device according to claim 1, which is an organic field effect transistor (OFET), thin film transistor (TFT), organic integrated circuit, radio frequency identification (RFID) tag, photodetector, sensor, logic circuit, memory element, capacitor, charge injection layer, Schottky diode, planarising layer, antistatic film, conducting substrate or pattern, or organic plasmon-emitting device, photoconductor, electro-photographic device, xerographic device, organic solar cell, dye-sensitized solar cell, organic spintronic device or field-quench device.

* * * * *